United States Patent [19]

Aujla et al.

[11] Patent Number: 4,589,720

[45] Date of Patent: May 20, 1986

[54] PLANAR ELECTRONIC FILTER ELEMENT AND A CONNECTOR EMBODYING SUCH A FILTER

[75] Inventors: Sharanjit S. Aujla; Richard J. Middlehurst, both of Kanata; John P. Simpson, Nepean, all of Canada

[73] Assignee: Northern Telecom Limited, Montreal, Canada

[21] Appl. No.: 515,561

[22] Filed: Jul. 20, 1983

[51] Int. Cl.$^4$ .............................................. H03H 7/00
[52] U.S. Cl. .................................. 339/147 R; 333/185
[58] Field of Search ............................... 333/181–185; 339/147 R, 147 P

[56] References Cited

U.S. PATENT DOCUMENTS

| | | | |
|---|---|---|---|
| 3,638,147 | 1/1972 | Denes | 333/185 |
| 4,079,343 | 3/1978 | Nijman | 339/147 R |
| 4,083,022 | 4/1978 | Nijman | 339/147 R |
| 4,144,509 | 3/1979 | Boutros | 339/147 R |
| 4,215,326 | 7/1980 | Hollyday | 339/147 R |
| 4,296,390 | 10/1981 | Vanderheyden et al. | 339/147 R |

OTHER PUBLICATIONS

"A New Approach to the Design of EMI Filter Connectors Using Planar Filters", Twelfth Annual Connector Symposium, by Kamal S. Boutros, Oct. 17–18, 1979.

*Primary Examiner*—Gil Weidenfeld
*Assistant Examiner*—Gary F. Paumen
*Attorney, Agent, or Firm*—Sidney T. Jelly

[57] ABSTRACT

A planar electronic filter has at least two dielectric plates with a ground plate between them and a plurality of parallel spaced electrodes on the outer surface of each plate. A contact area on at least one end surface connects with the ground plate. Usually contact pins are mounted, as by soldering, on the electrodes, a pin on each electrode, with the ends of the pins extending beyond the sides of the plates. The pin ends may be of male or female form, or can be formed for solder or wire wrapping attachment of conductors. The filter is generally mounted in a housing and it can be arranged that contact pins are not mounted on the electrodes but contact members in the housing make direct contact with the electrodes. A connector embodying the filter can comprise one or two housings. One housing can insert into the other and make contact with the filter.

14 Claims, 15 Drawing Figures

PLANAR ELECTRONIC FILTER ELEMENT AND A CONNECTOR EMBODYING SUCH A FILTER

This invention relates to a planar electronic filter element, and to a connector embodying such a filter element.

Increasing regulations relating to communication and data-processing systems, such as telecommunications systems, has increased the need for a low cost and efficient filter and filter connector. The present invention provides such a filter and filter connector, utilizing a capacitive multiplane planar filter element.

A filter, in the present invention, comprises a plurality of dielectric plates sandwiched together, a ground plate being positioned between two plates and electrode stripes being formed on the plates on surfaces remote from the ground plate. Opposite end surfaces can be metallized to provide for connection to the ground plane, and pins or other forms of terminals are attached to the stripe electrodes. It is possible to provide a stacked assembly, with more than one ground plane.

Previously, planar elements have been used, with electrode patterns on the outer surfaces of the dielectric plates and a ground plate patterned electrode between the dielectric plates. Pins are inserted in holes through the dielectric plates and are connected to the electrodes on the outer surfaces. Clearances are provided in the ground electrode around the pins to prevent shorting and electrical breakdown. Such construction is relatively complex and expensive and obtaining good alignment between electrodes on the outer surfaces and the electrode patterns between the dielectric plates is often difficult. This can make obtaining accurate and consistent electrical characteristics difficult and expensive.

In the present invention, a plurality of parallel, spaced, electrode stripes are formed across the outer surfaces. Terminal pins can be mounted on the electrodes, or conductors attached to the electrodes. Alternatively, contact with the electrodes can be made by contact members in cooperating parts. No forming of holes in the dielectric plates is necessary. The ground electrode or plate can extend in a continuous layer between the dielectric plates and the electrodes on the outer surfaces of the plates are easily and accurately positioned, generally in the form of spaced parallel stripes. Alignment problems are greatly reduced. The filter element is readily mounted in housings to form a connector which readily accepts and connects to standard forms of connector.

Broadly, the invention comprises a filter having at least two dielectric plates in a sandwich formation, with a ground plate between; and a plurality of parallel spaced, electrodes on each outer surface of the two dielectric plates. Terminals can be connected to the electrodes, and the terminals can extend beyond one or both side surfaces of the plates. Conveniently the dielectric plates are of ceramic. Terminals, if provided, are conveniently soldered to the electrodes. A contact is provided at at least one end for connection to the ground plane.

A feature of the invention comprises a connector embodying a filter as defined above, the filter positioned in cooperating housings to which at least one connector can be connected. Typically the connector of the invention can be a bulkhead mounting connector or, for example, a twenty-five pair telephone connector.

The invention will be readily understood by the following description of certain embodiments, by way of example, in conjunction with the accompanying drawings in which:

FIG. 15 is a partial perspective view of a filter as in FIGS. 9 and 11 to 14; and.

Figure 1:
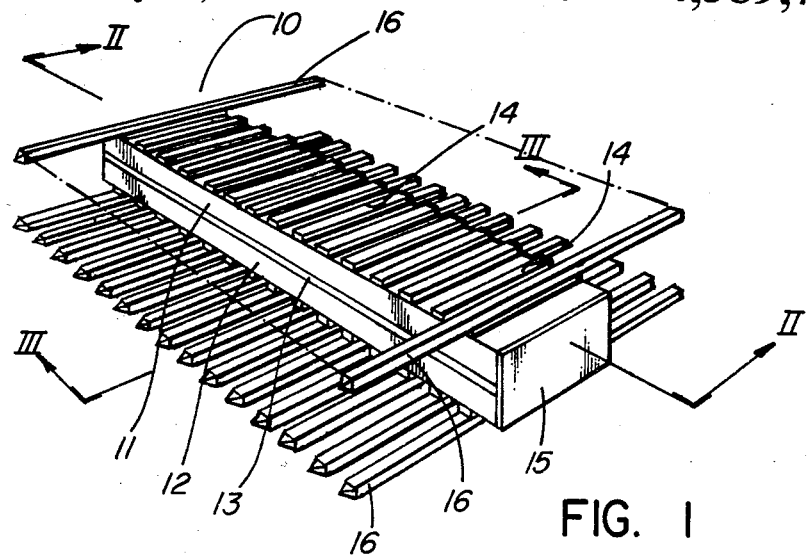
FIG. 1 is a perspective view of one form of filter in accordance with the invention.
Figure 2:
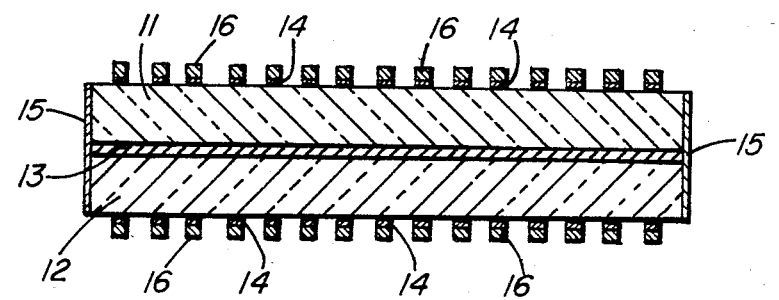
FIGS. 2 and 3 are cross-sections on the lines II—II and III—III respectively of FIG. 1.
Figure 3:
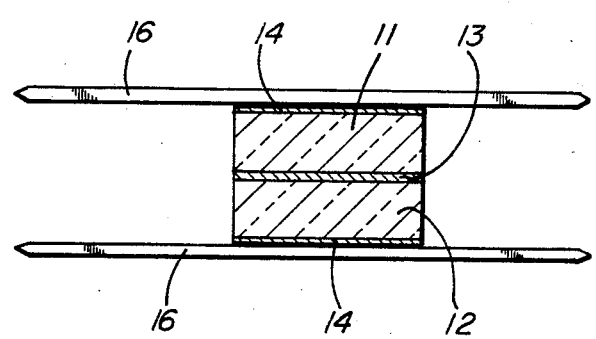

FIGS. 1, 2 and 3 illustrate a particular form or shape of filter element 10 having two planar ceramic plates 11 and 12 with a metal ground plane 13 sandwiched between. The outer, top and bottom surfaces of the plates 11 and 12 have spaced parallel stripes 14 of metallizing formed thereon. The stripes 14 form electrodes, having a capacitor effect with respect to the ground plane 13. The end surfaces of the element are metallized, at 15. In the example, terminal pins 16 are soldered to the stripes 14. Normally a terminal is attached to each stripe.

Figure 4:
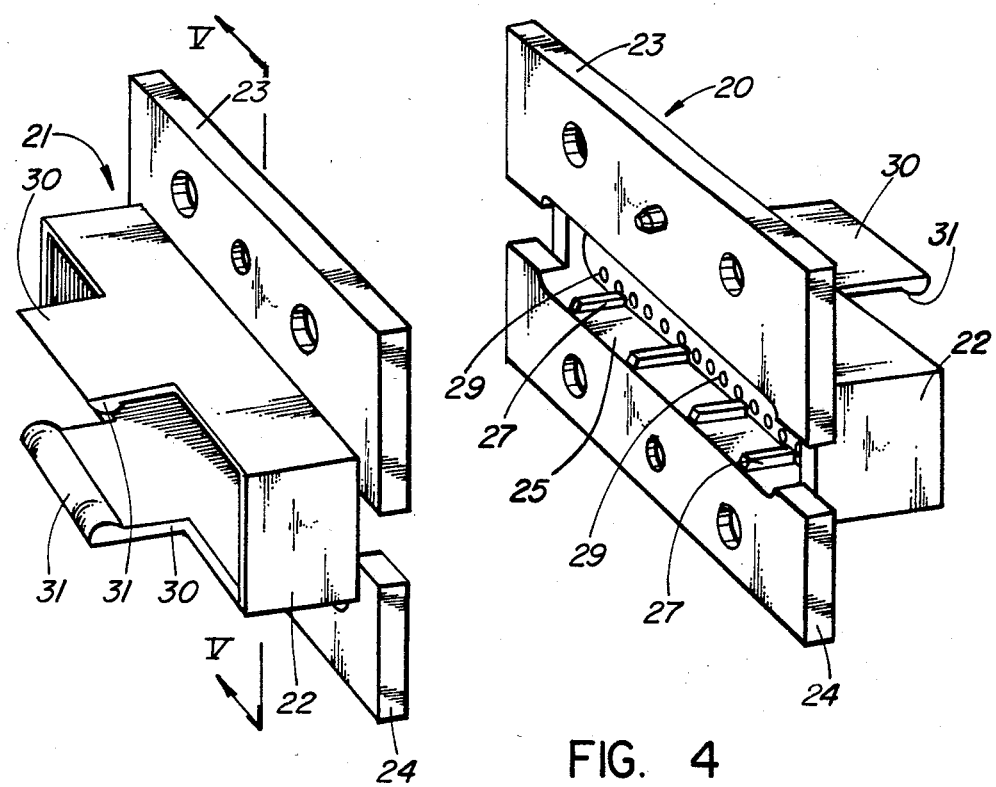
FIG. 4 is an exploded perspective view of two housings for one form of connector in accordance with the invention.
Figure 5:
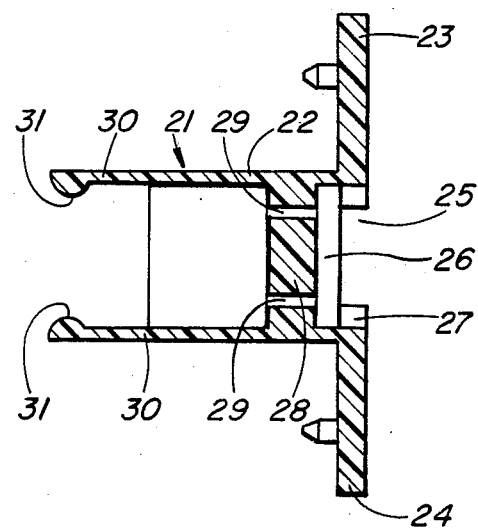
FIG. 5 is a cross-section on the line V—V of FIG. 4.

FIG. 4 illustrates one form of connector, with two housings, for bulkhead mounting with FIG. 5 viewing a housing in section. The connector has two housings 20 and 21 which are, in the example, the same. Each housing has a box-like main body portion 22 with a flange 23 extending upwardly and another 24 extending downwardly from the front surface of the body portion. The opposed housings define a space 25 within which a filter element, as in FIGS. 1, 2 and 3 can fit. A shallow recess 26 is provided in the front surface of the body portion. Ribs 27 can be provided so that the filter element contacts the surfaces of the ribs, rather than the terminals 16 contacting the surfaces in the space and recess. The inner wall 28 of the main body portion has holes 29 therethrough for reception of the terminals 16 (FIG. 1).

Extending rearwards from the main body portion 22 are two parallel beams 30. The beams have inwardly extending ribs 31 which have convex inner surfaces. Cable connectors are inserted into the housings 22 and the ribs 31 snap into recesses in the sides of the connectors.

Figures 6, 7:
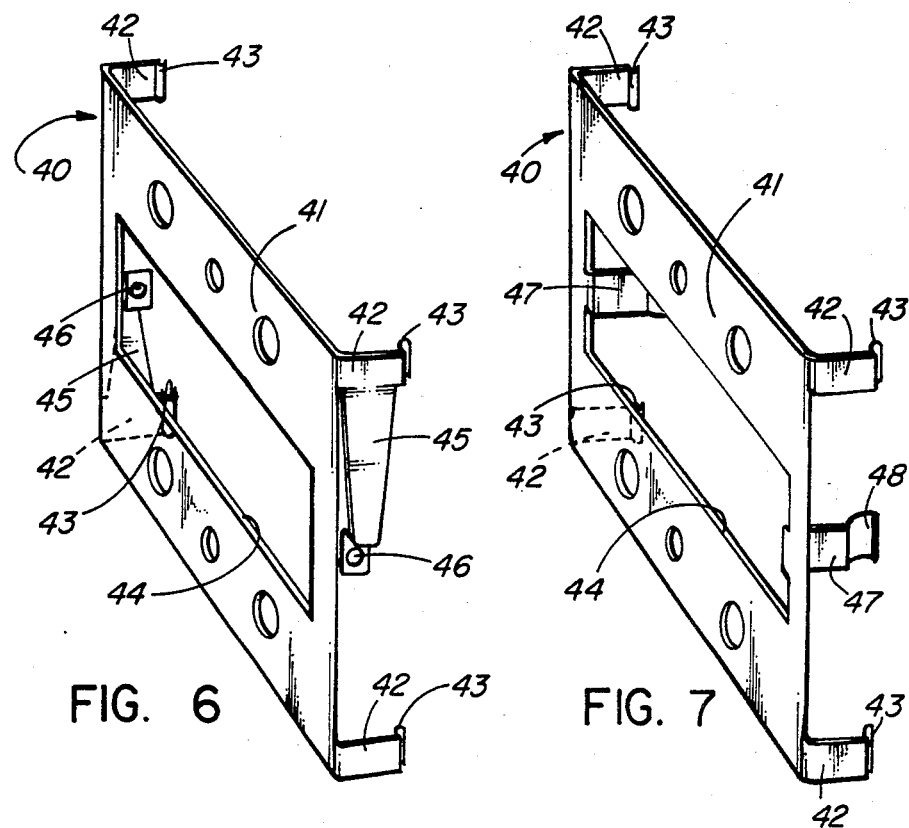
FIGS. 6 and 7 illustrate two alternate forms of ground connecting member.

FIGS. 6 and 7 illustrate two alternate forms of a ground connecting member, 40. The member 40 makes contact with the metallized ends 15 of the filter element and are in turn connected to a ground. Both examples have a flat plate-like main portion 41 with laterally extending arms 42. The arms have inwardly extending ribs 43 and the arms 42 and ribs 43 are dimensioned to be a close fit over the two sets of flanges 23 and 24 when the two housings 20 and 21 are assembled together. An aperture 44 permits passage of the filter elements with clearance between terminals 16 and the ground member 40. The difference between the two examples of FIGS. 6 and 7 is in the spring contacts which make contact with the metallized ends 15. In FIG. 6, a cantilevered spring arm 45 extends from one of the arms 42, an arm 45 at each end. The free end of each arm 45 is formed with a dome, at 46, which makes contact with a metallized end 15. In FIG. 7, an arm 47 extends from the main portion 41, an arm at each end. An arcuate portion 48 on each arm 47 makes contact with the metallized ends.

Figure 8:
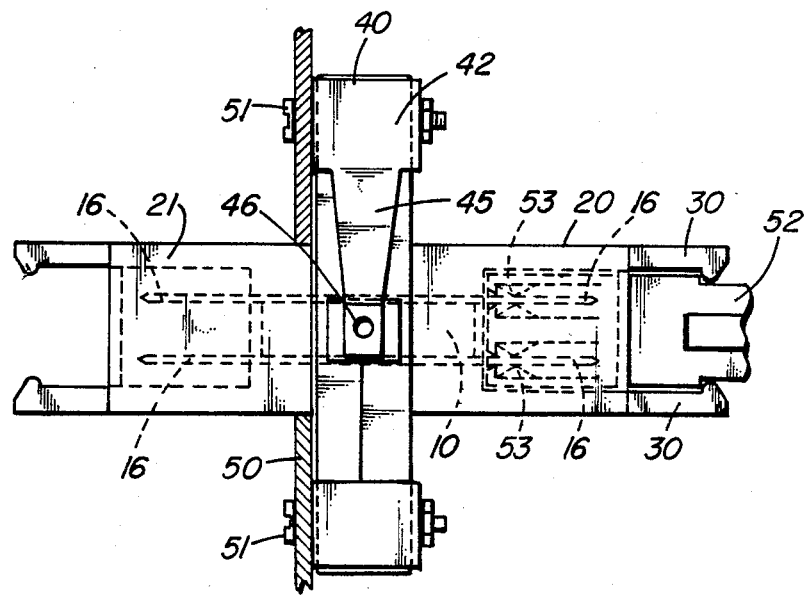
FIG. 8 is an end view of a bulkhead mounting connector.

FIG. 8 illustrates a connector, with filter element, mounted on a bulkhead. The bulkhead is indicated at 50. One housing 21, extends through the bulkhead. A connector assembly comprising two housings 20 and 21, a filter element 10 held in the housings and a ground connecting member 40 are attached to the bulkhead 50 by bolts and nuts 51. In FIG. 8, a cable connector 52 is shown inserted in housing 20. Contact members in the cable connector, indicated at 53, make contact with the pins 16.

The terminal pins 16 are only one form of terminal which can be connected to the stripes 14. Box terminals or other forms of hollow terminals can be used and also terminals which are hollow at one end and of solid, pin form, at the other. Flat terminals can also be provided. The form of terminal provided will depend upon the particular form of contact or terminal in the cable connector to be connected to the filter.

While the filter element is illustrated as being used in a bulkhead mounting connector it can be used in other forms of connectors. For example, it can be part of a conventional telephone connector—often referred to as a twenty-five pair telephone connector. This comprises a male connector and a female connector, each attached to a cable, one cable from a telephone set or other terminal and the other cable going to a central station. The filter can conveniently be in the connector which is attached to the cable going to the central station, but can alternatively be in the other connector. The filter element can also be mounted in a connector which is mounted on a printed circuit board. In such a use, a cable connector may be inserted on one side while at the other side the filter element terminals can be connected to a circuit pattern on the circuit board. In such arrangements an individual connector may comprise one housing with the filter element therein.

Figure 9:
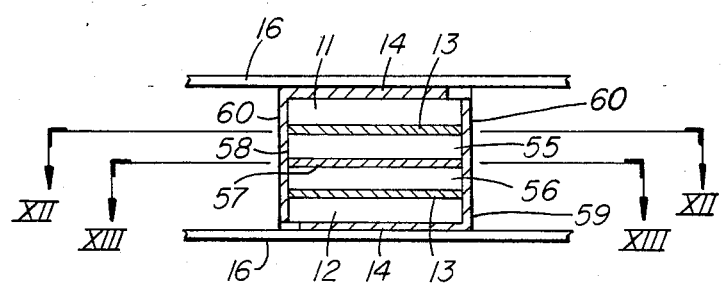
FIG. 9 is a cross-section similar to FIG. 2, illustrating an alternative form of filter.
Figure 11:
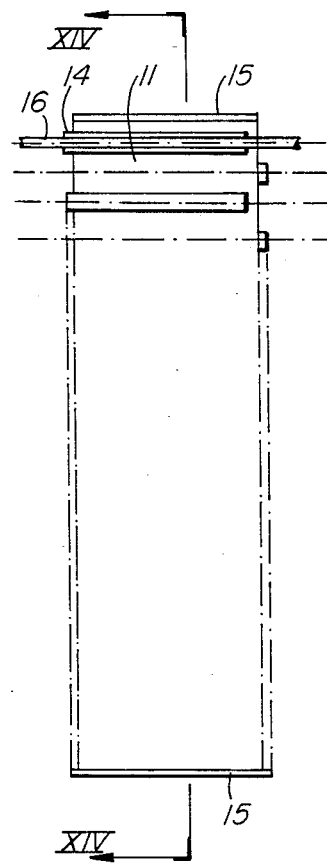
FIG. 11 is a top plan view of the arrangement of FIG. 9.
Figures 12, 13:
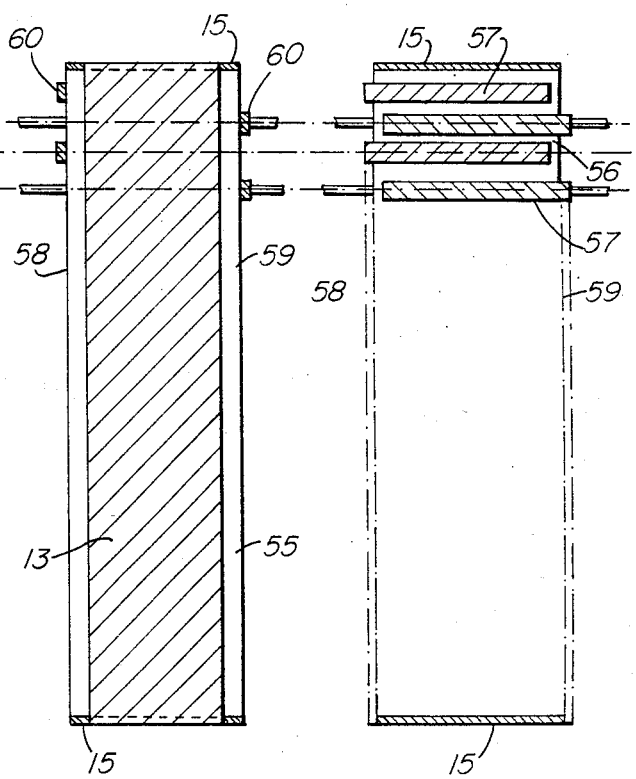
FIGS. 12 and 13 are cross-sections on the lines XII—XII and XIII—XIII respectively on FIG. 9.
Figure 14:
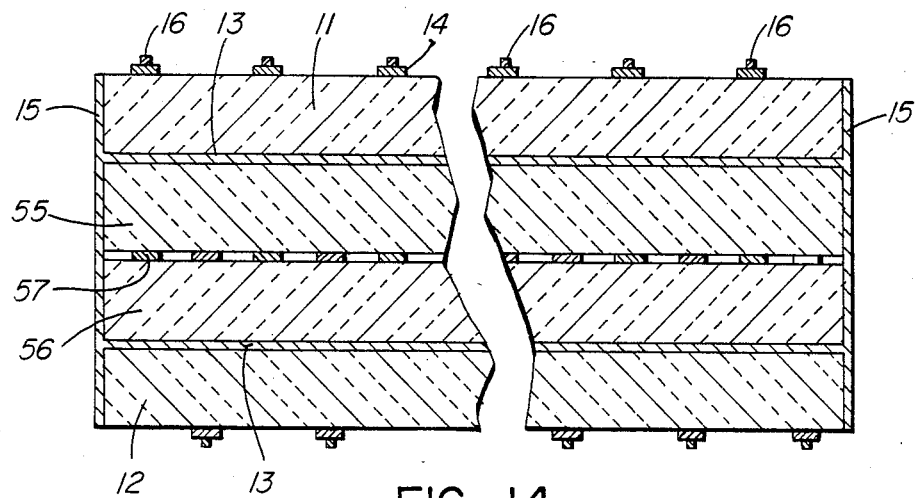
FIG. 14 is a cross-section on the line XIV—XIV on FIG. 11.
Figure 15:
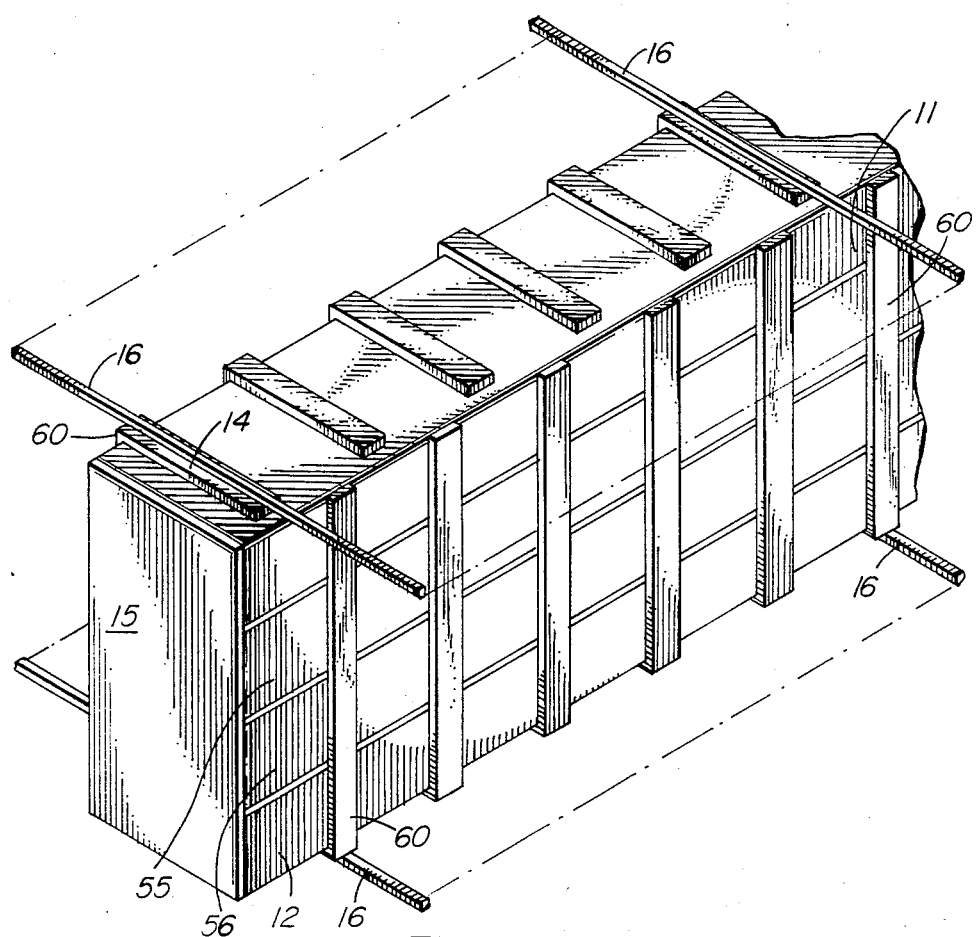

A filter element can comprise more than two dielectric plates. In such an arrangement, in addition to stripe electrodes 14 on the outer surfaces, there will be further electrodes at intermediate surfaces. Connections would then be necessary and this would require that the ground plane 13 not extend to the side surfaces. A transverse cross-section through one alternative form of filter is illustrated in FIG. 9 while a top plan view and longitudinal cross-sections at various levels are illustrated in FIGS. 11, 12 and 13. FIG. 14 is a longitudinal cross-section normal to the plane of the cross-sections of FIGS. 12 and 13 and FIG. 15 is a perspective view of part of such a filter. In the arrangement of FIG. 9, and FIGS. 11 to 15 in which common reference numerals are used for items common with FIGS. 1, 2 and 3, two additional ceramic plates 55 and 56 are provided. There are two ground planes 13 which are both in contact with metallized end surfaces 15. In this example, the ground planes do not extend to the side edges of the plates. A central plurality of stripe electrodes 57 extends between the two plates. Alternate stripe electrodes 57 extend to one side edge 58 of the plates, stopping short of the other side edge 59. The intervening stripe electrodes extend to side edge 59 and stop short of edge 58. Stripe connections 60 extend down the side edges 58 and 59 to interconnect top and bottom stripe electrodes alternately with central stripe electrodes 57. Other arrangements can be provided. It will be appreciated that the thickness of the ground planes 13 and central stripe electrodes 57 is very much exaggerated, in FIG. 9, and in FIGS. 11 to 15, for clarity. In practice, these would be very thin and no difficulties would arise in forming the connections 60, and spanning any extremely thin gaps between the plates 11 and 55, 55 and 56 and 56 and 12.

Figure 10:
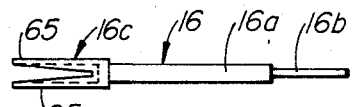
FIG. 10 is a side view of one form of terminal pin.

The terminal pins 16 can be of many different forms, depending upon the particular installation or assembly. Thus the pins can be of male form both ends, female form both ends, male for one end and female the other end. One end can be male or female as desired and the other end be suitable for solder attachment or wire wrapping attachment of conductors. FIG. 10 illustrates one form of pin 16 in which the central portion 16a is of rectangular cross-section, one end portion 16b is of circular cross-section and of male form, and the other end portion 16c is of female form with two arcuate legs 65 formed and spaced to accept a round male terminal part, for example a part similar to portion 16b.

It is also possible that conductors are soldered directly on to the electrodes 14 at one end of each stripe. Pins can also be soldered to the stripes and project beyond the other ends of the stripes. In yet another arrangement, such as in a telephone connector, it can be arranged that as two connector parts are pushed together, in the filter element in one part slides between spaced contacts in the other part, contact being made directly between the contacts and the stripes as the connector is assembled.

It will be seen that a variety of arrangements for connecting conductors to the electrodes or stripes 14 can be provided and that conductors can be attached directly, as by soldering, by connection to terminal pins attached to the stripes or electrodes, or via terminals which make contact with the stripes or electrodes as parts of a connector are assembled.

The overall dimensions of the filter element are set by connector parameters, for example terminal pin pitch and row spacing. Electrical characteristics can be adjusted by selection of materials for the dielectric members i.e. ceramic plates 11 and 12, and also by design of the electrode pattern. The filter element is particularly suitable for use in the 1–200 MHz frequency range.

What is claimed is:

1. An electronic filter comprising at least two planar dielectric plates in a sandwich formation with a planar ground plate extending between the dielectric plates; a plurality of parallel spaced electrodes on each outer surface of the dielectric plates, the electrodes on each outer surface extending in a plane parallel to the plane of the ground plate; a plurality of spaced parallel terminal pins attached to said electrodes, a terminal pin on each electrode, the terminal pins extending in two spaced planes parallel to the plane of the ground plate; and contact means on at least one end connected to said ground plate.

2. A filter as claimed in claim 1, said terminal pins extending beyond at least one side surface of the sandwich formation.

3. A filter as claimed in claim 2, said pins being formed at one end for solder attachment of conductors.

4. A filter as claimed in claim 1, said terminal pins having a male form at least at one end.

5. A filter as claimed in claim 1, said terminal pins extending beyond both side surfaces, at least one end of each pin being of male form.

6. A filter as claimed in claim 5, one end of each pin being of male form and the other end of each pin being of female form.

7. An electrical connector including an electronic filter, comprising:
   a housing;
   an electronic filter in said housing, said filter having at least two planar dielectric plates in a sandwich formation with a planar ground plate extending between the dielectric plates; a plurality of parallel spaced electrodes on each outer surface of the dielectric plates, the electrodes on each outer surface extending in a plane parallel to the plane of the ground plate; a plurality of parallel spaced terminal pins attached to said electrodes, a terminal pin on each electrode, the terminal pins extending in two spaced planes parallel to the plane of the ground plate; and contact means on at least one end in contact with said ground plate;
   means in said housing for entry of conductors into said housing and for connection to terminal pins on one side of the filter;
   means in said housing in contact with said contact means on said at least one end; and
   an aperture in said housing for reception of a further member, said further member including contacts for connection to terminal pins on the other side of the filter.

8. A connector as claimed in claim 7, each terminal pin extending beyond at least one side of the filter.

9. A connector as claimed in claim 8, said terminal pins having a male form at least at one end.

10. A connector as claimed in claim 8, said terminal pins extending beyond both sides of the filter at least one end of each pin being of male form.

11. A connector as claimed in claim 10, one end of each pin being of male form and the other end being of female form.

12. A connector as claimed in claim 8, said pins being formed at one end for solder attachment of conductors.

13. An electrical connector including an electronic filter, comprising first and second housings, each housing having a box-like main body portion and a flange extending upwardly and a flange extending downwardly from a front surface of the main body portion, the housings being adapted to be assembled with said flanges in opposition, the body portions defining a space, and an electronic filter mounted in said space, said electronic filter comprising at least two planar dielectric plates in a sandwich formation with a planar ground plate between the plates, a plurality of parallel spaced electrodes on each outer surface of the dielectric plates and a terminal pin mounted on each electrode, the electrodes and the terminal pins extending in planes parallel to the plane of the ground plate, the ends of the pins extending beyond the sides of the filter into each housing, a contact area on at least one end of the filter connected to said ground plate, an aperture at the rear of each housing for insertion of a cable terminating member to make contact with the ends of said pins, and a ground contact member on the connector making contact with said contact area.

14. A connector as claimed in claim 13, each housing including resilient retaining means for retaining each said cable terminating member in the related housing.

* * * * *